United States Patent [19]

Heritage

[11] 4,039,810
[45] Aug. 2, 1977

[54] ELECTRON PROJECTION MICROFABRICATION SYSTEM

[75] Inventor: Marcus Barry Heritage, Katonah, N.Y.

[73] Assignee: International Business Machines Corporation, Armonk, N.Y.

[21] Appl. No.: 701,438

[22] Filed: June 30, 1976

[51] Int. Cl.² .............................................. H01J 37/00
[52] U.S. Cl. ........................ 250/396 ML; 250/492 A
[58] Field of Search ........................... 250/492 A, 396; 148/1.5; 219/121 EB; 29/584

[56] References Cited

U.S. PATENT DOCUMENTS

| 2,941,077 | 6/1960 | Marker | 250/396 |
| 3,901,814 | 8/1975 | Davis et al. | 250/492 A |
| 3,956,635 | 5/1976 | Chang | 250/492 A |

Primary Examiner—Alfred E. Smith
Assistant Examiner—T. N. Grigsby
Attorney, Agent, or Firm—Charles P. Boberg

[57] ABSTRACT

An electron beam image of a microcircuit pattern is projected from an irradiated photocathode window to a resist-coated silicon wafer through two successive lens systems having field-containing regions which communicate through a small aperture in a common pole structure that otherwise shields these regions from each other. The lens region in which the photocathode is located contains electrostatic and magnetic fields for accelerating the electrons and focusing the beam toward a crossover point in the aperture. The region in which the wafer is positioned contains only a magnetic field to correct aberrations of the beam image. The arrangement permits reduction of the image size. Beam registration detectors and deflecting devices are located near the aperture in the common pole structure. Because it is isolated from objects located outside of its own lens region, the electrostatic field is not perturbed by these detecting and deflecting devices or by variations in flatness of the wafer surface. Back-scattered electrons emitted from the wafer cannot be driven by the electrostatic field onto parts of the wafer surface where no exposure to electron rays is desired. The photocathode is protected from exposure to contaminants emitted by the wafer coating due to the restricted opening between the lens regions.

7 Claims, 6 Drawing Figures

ELECTRON PROJECTION MICROFABRICATION SYSTEM

BACKGROUND OF THE INVENTION

This invention relates to systems for fabricating microcircuitry by causing electron beam images of circuit patterns formed by masks to be projected upon sensitized silicon substrates or wafers, and it relates particularly to a microfabrication system of the type in which the electron beam image is projected from an irradiated photocathode window that is selectively masked to define the pattern areas from which photoelectrons may be emitted to form an electron beam having the desired image configuration.

The photocathode projection method just described has an advantage over other types of electron image-forming techniques in that the mask is not required to be self-supporting; hence it may be formed exactly in accordance with the desired pattern without having to provide supporting connections to unexposed areas that are completely surrounded by exposed areas. Thus, it avoids the kind of image distortion known as the "stencil problem". As constructed heretofore, however, photocathode projection devices have been subject to certain disadvantages. For instance, if contaminants emitted by the resist-coated substrate reach the photocathode, they have an adverse effect upon the photocathode and shorten its life. In prior structures of this type there has been no feasible way to shield the photocathode from such contaminants.

Other disadvantages of prior photocathode projection devices have arisen from the fact that in such devices it is customary to have the wafer surface exposed to the electrostatic field which drives the electrons from the photocathode to the wafer. This makes it difficult to register the projected image with respect to alignment marks on the wafer, because any registration signal detector which is employed to sense the electrons that are backscattered from the alignment marks will have to be positioned within the electrostatic field, causing perturbations therein which tend to distort the image. Registration detectors utilizing X-rays have been proposed to overcome this problem, but they have not proved satisfactory in practice. Another disadvantage of having the wafer positioned in the electrostatic field is that any variations in the flatness of the wafer surface will cause perturbations of the electrostatic field, with consequent distortion of the reproduced image. Moreover, as the electron beam impinges areas of the wafer surface that correspond to the unmasked areas of the photocathode, some of the backscattered electrons produced by the beam will be driven by the electrostatic field back onto portions of the wafer surface which correspond to masked areas of the photocathode, thereby lessening the contrast between masked and unmasked areas and lowering the quality of the circuit pattern produced on the wafer, as well as making it difficult to detect alignment marks accurately.

Still another disadvantage of prior photocathode projection devices is the fact that they are inherently limited to a 1:1 reproduction ratio. Therefore, the circuit pattern on the photocathode must be of the same small size as the image thereof which is being microfabricated on the wafer, making it difficult and/or expensive to form a highly accurate pattern on the photocathode.

SUMMARY OF THE INVENTION

An object of the present invention is to provide an improved electron beam projection technique which enables a photocathode to be used as the image-forming element without encountering the disadvantages described above.

In accordance with the invention, the electron beam image formed by the photocathode is projected to the wafer through two successive lens systems which communicate with each other through a small aperture in a common pole piece structure that otherwise separates and electrostatically isolates the two regions wherein the lens activity occurs. Only the region containing the photocathode has an electrostatic field therein for accelerating the electrons from the photocathode toward the wafer. This region also contains a magnetic field of such character that it will focus the electron beam to a crossover point within the aperture. The other region, in which the wafer is located, contains a second magnetic field that is designed to compensate for aberrations introduced by the combination of the first magnetic field and the accelerating electrostatic field. Contaminants emitted by the resist coating on the wafer are confined almost entirely to the second lens region and do not reach the photocathode in any detrimental quantity because of the very restricted opening between the two regions. The axial lengths of the two regions are proportioned to effect a size reduction of the projected image so that the circuit pattern which is defined by the mask on the photocathode can be considerably larger than the actual size of the pattern to be microfabricated, making it easier to form an accurate mask and thereby enhancing the accuracy of the microfabricated pattern. Inasmuch as the wafer is not exposed to the electrostatic field, it cannot cause perturbations thereof. Backscattered electrons which are emitted from areas of the wafer surface impinged by the beam will be free of the electrostatic field and therefore will not be directed by this field onto areas of the wafer surface where no exposure to electron rays is desired. By thus isolating the electrostatic field from the wafer and providing a beam crossover as described, the rays of the electron beam can be directed to the wafer surface in such a manner as to insure good image reproduction and reliable registration of the wafer. Registration detectors are located so that they are not within the electrostatic field (being positioned adjacent to the beam crossover point within the pole piece structure containing the aperture, for example); hence, registration can be accomplished by the preferred technique of sensing electrons backscattered from the wafer without perturbing the electrostatic field to any significant extent.

Other and further objects, features and advantages of the invention will be apparent from the following more particular description of the preferred embodiment of the invention, as illustrated in the accompanying drawings.

DETAILED DESCRIPTION OF A PREFERRED EMBODIMENT

In the following description, terms such as "vertical," "horizontal," "upper" and "lower" are used in a relative sense and are not intended to imply any limitations upon the positioning of the disclosed apparatus when it is used in service.

Figure 1:
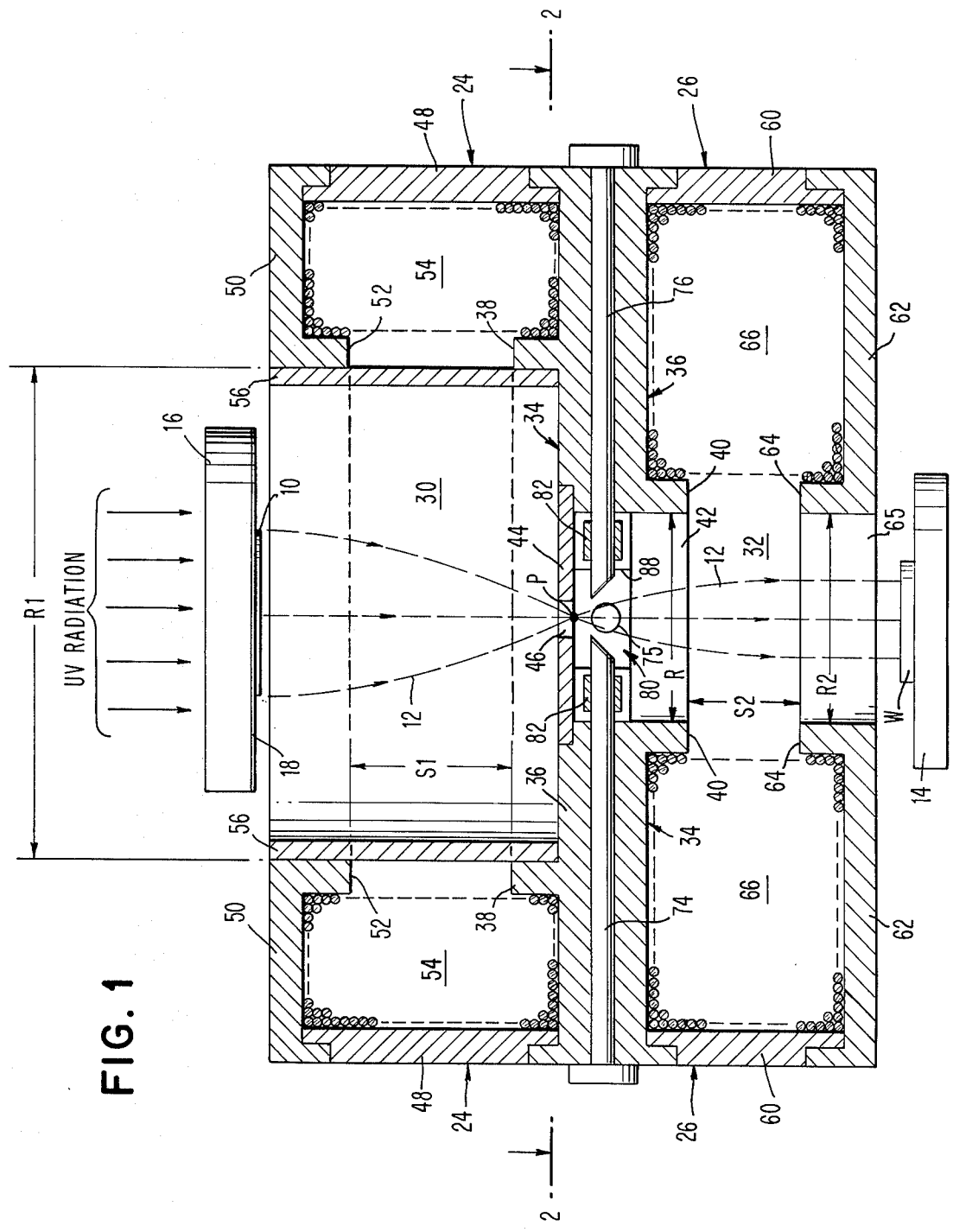
FIG. 1 is a vertical section through an exemplary photocathode electron projection apparatus embodying the invention.
Figure 2:
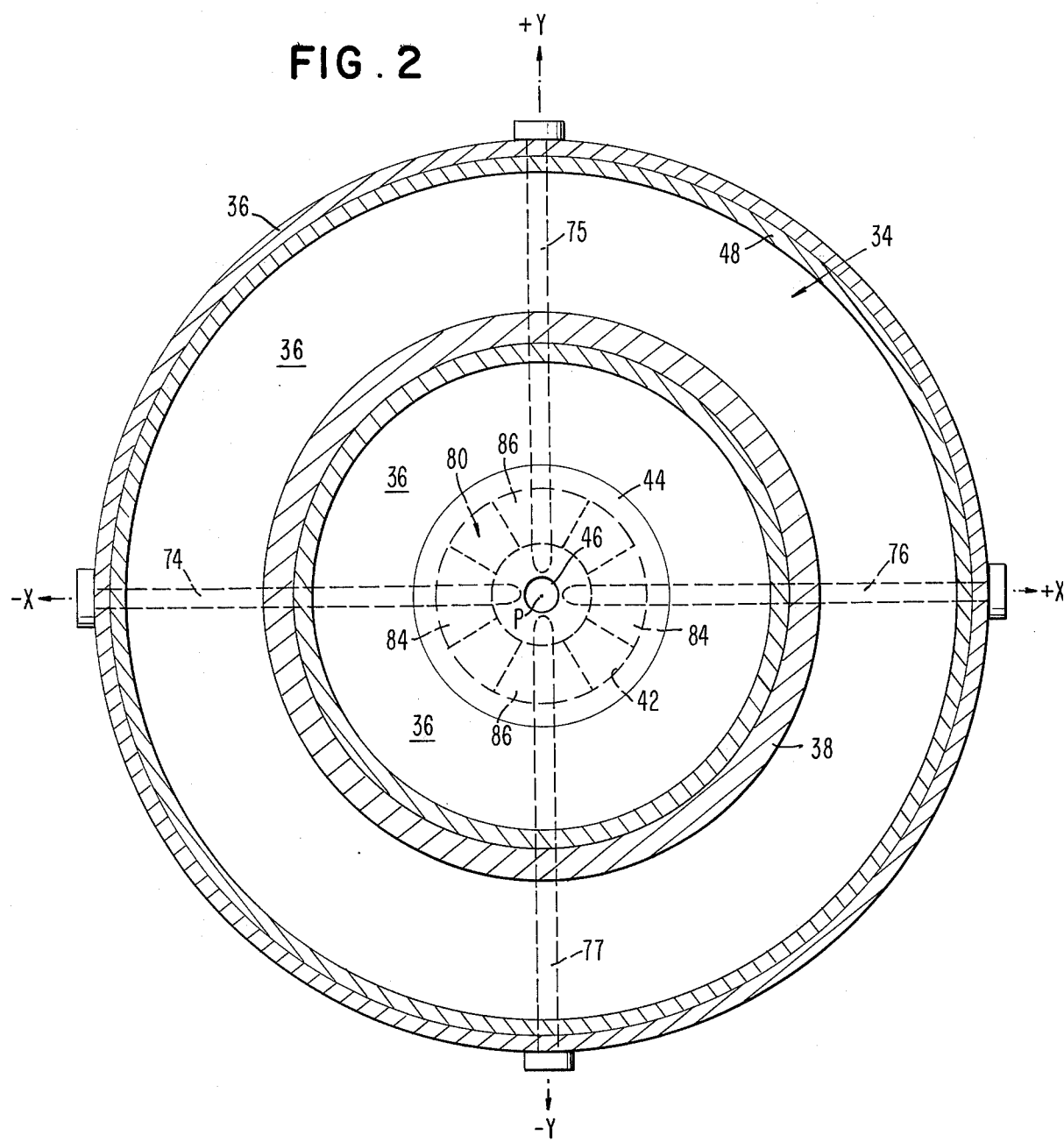
FIG. 2 is a horizontal section of said apparatus taken on the line 2—2 in FIG. 1.

FIGS. 1 and 2 illustrate an electron beam microfabrication apparatus wherein a photocathode window element 10 appropriately masked to define a desired microcircuit pattern is exposed to ultraviolet radiation for producing a beam 12 of photoelectrons emitted from the unmasked areas of the photocathode 10. The electron beam 12 has a cross-sectional configuration corresponding in shape but not necessarily in size to the pattern defined by the unmasked portions of photocathode 10, and the image thus formed by the beam 12 is projected upon a workpiece W such as a silicon wafer coated with photoresist material mounted upon a support 14, thereby forming upon workpiece W a reproduced image of the original pattern defined by the photocathode 10.

Figure 3:
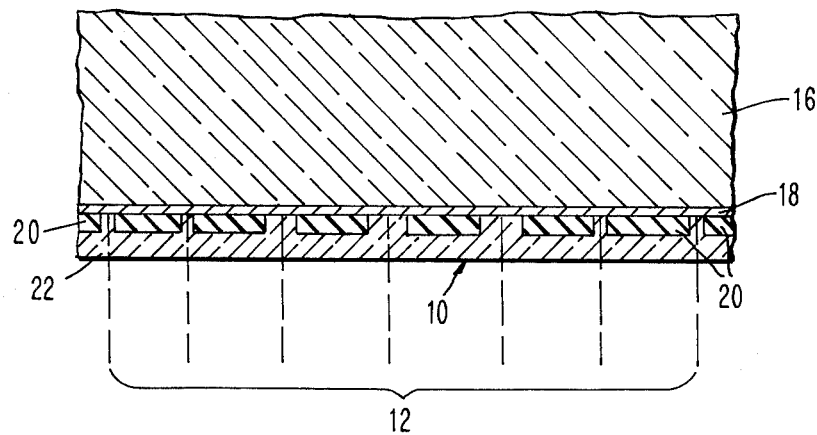
FIG. 3 is a fragmentary sectional view on an enlarged scale showing details of the photocathode window.

FIG. 3 shows some of the details of the photocathode window construction. The photocathode 10 is mounted upon the underside of a supporting disk 16 made of quartz or other material which is highly transmissive to ultraviolet (UV) radiation. The underside of disk 16 also is coated with a layer 18 of electrically conductive material such as gold which is sufficiently thin so that it does not substantially interfere with the transmission of UV radiation, this conductive layer 18 serving as the negative electrode of the means for producing an electrostatic field as explained hereinafter. The photocathode 10 comprises a masking layer 20 of material opaque to UV radiation (such as tantalum oxide) which has been etched out in selected areas to define the circuit pattern which is to be reproduced upon the workpiece W. The mask 20 is coated by a layer 22 of photoemissive material (such as caesium iodide) which can be activated by UV radiation in the unmasked areas thereof to emit rays of photoelectrons which together constitute the image-transfer beam 12.

Referring again to FIG. 1, it is a distinctive feature of the present invention that the electron beam 12 passes successively through two magnetic lens structures 24 and 26, the first of which (upper lens 24) produces an electrostatic field for accelerating the electrons in the beam 12 toward the target W, and the second of which (lower lens 26) is free of any applied electrostatic field. Both lenses produce magnetic fields for focusing the electron beam 12, and their properties are such that the beam has an axial crossover point P in a plane which lies between a first region 30 in which the electrostatic and magnetic fields of the upper lens 24 are produced and a second region 32 in which there is a magnetic field produced by the lower lens 26. By virtue of the focusing actions of the magnetic fields in regions 30 and 32, the beam 12 is able to project upon the workpiece 12 an image of smaller size than the pattern formed on the photocathode 10. This image reduction capability is important because it enables the photocathode mask to be formed with an enlarged pattern that can be made more accurately than could a pattern of the same small size as the reproduced image thereof on the wafer W.

The lenses 24 and 26, FIGS. 1 and 2, are of generally annular construction. They share an annular partitioning structure 34 which serves in part as a common magnetic pole member and in part as an electrostatic shield between the upper and lower lens regions 30 and 32. Included in the partition 34 is a magnetic member 36 having an annular portion 38 which provides a lower pole piece for the upper lens 24 and another annular portion 40 which provides an upper pole piece for the lower lens 26. The plane in which the beam crossover point P is located extends through the partition 34 in generally parallel relation therewith, and the magnetic member 36 has a central cylindrical opening or bore 42 whose axis is aligned vertically with the point P. At the upper end of opening 42 the member 36 is recessed to provide an annular shoulder in which is seated a circular plate or disk 44 of nonmagnetic metal such as aluminum which has a small central aperture 46 in the vicinity of the point P to provide a restricted opening through which the electron beam 12 passes from the upper lens region 30 to the lower lens region 32. The disk 44 is part of the electrostatic shield provided by the partitioning structure 34 between regions 30 and 32. In the illustrated embodiment, as shown best in FIG. 1, the beam crossover point P is in a plane defined by the lower surface of the nonmagnetic disk 44. However, the positioning of the crossover point P along the vertical axis of beam 12 is subject to some optional variation to suit individual requirements.

To complete the description of the lens structures, the upper lens 24 has an outer cylindrical shell 48 of magnetic material extending between the common magnetic member 36 on its lower side to an upper magnetic member 50 on which is formed the annular upper pole piece 52 of lens 24. In the annular space between the outer shell 48 and the pole pieces 38 and 52 there is disposed a wire coil or winding 54 for producing the magnetic focusing field in the upper lens region 30. Positioned radially inward of and adjoining the pole pieces 38 and 52 is a cylindrical sleeve 56 of nonmagnetic metal such as aluminum which serves as part of the positive electrode or anode of the means for producing the electrostatic field in the upper lens region 30. The anode also may be considered to include the apertured disk 44 and the portion of the structural member 36 lying between the disk 44 and sleeve 56. The surfaces of parts just described which bound the region 30 are accurately finished so that the electrostatic field within region 30 will have the desired distribution.

The lower lens 26 is constructed in a manner similar to that of the upper lens 24 except that it does not include any elements for providing an electrostatic field in region 32. A cylindrical shell 60 of magnetic material extends from the common magnetic member 36 on its upper side to a lower magnetic member 62 on which is formed the annular lower pole piece 64 of lens 26. A central bore 65 in pole piece 64 is aligned axially with the bore 42 in pole member 36. In the annular space between the outer shell 60 and the pole pieces 40 and 64 is positioned the wire coil or winding 66 which produces the magnetic field in region 32.

Figure 4:
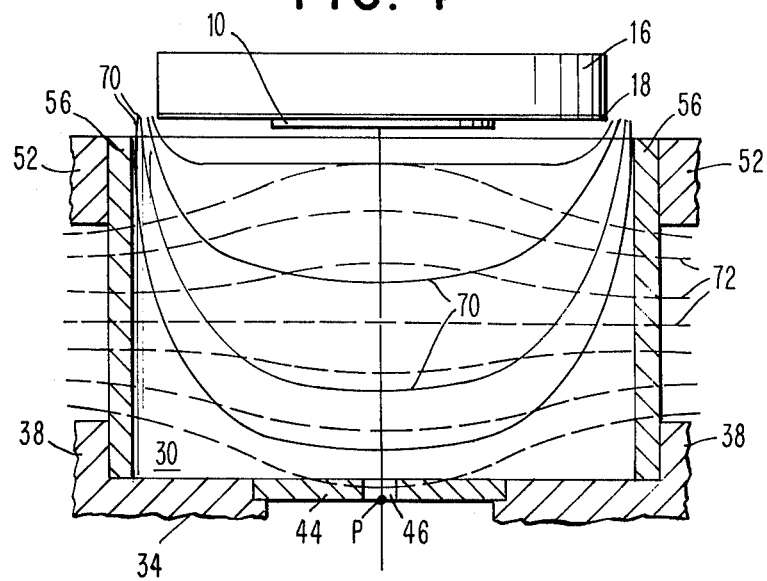
FIG. 4 is a sectional view through a portion of the upper lens structure illustrated in FIG. 1, showing the approximate configuration of the electrostatic field lines therein.

The distribution of the electrostatic potential in the upper lens region 30 with the electrode structures shown in FIG. 1 is represented schematically in FIG. 4, wherein the solid lines 70 depict the electrostatic potential lines produced. The magnetic potential lines set up between the poles 38 and 52 are represented by the broken lines 72 in FIG. 4. The electrostatic force tends to drive the electrons emitted from the photocathode 10 along paths are normal to the potential lines 70. The effect of the magnetic forces is more complex, but a simple analogy is to consider the lines of magnetic potential similar to the refracting surfaces of a glass lens. The net effect of the magnetic forces is thus to cause convergence of the electrons towards the axis of cylindrical symmetry. The electrostatic forces cause the acceleration of the electrons away from the photocathode along with some divergence from the axis of cylindrical symmetry. The two fields are thus arranged to cause acceleration of the electrons from the photocathode but with an overall convergence to the point P in the small aperture 46. The rays then may be permitted to diverge somewhat as they proceed below point P until they are within the magnetic field of the second lens region. The arrangement is such that the extent of divergence is less than the preceding extent of convergence in accordance with the degree of image reduction desired. This is primarily a function of the ratio between the pole piece gaps S1 and S2 in the upper lens 24 and lower lens 26, respectively.

The dominant off-axis image aberrations introduced by the magnetic and electrostatic fields in the upper lens 24 are compensated by equal and opposite aberrations introduced by the magnetic field of the lower lens 26. The pole piece gaps S1 and S2 and the radii R1 and R2 of the bores in the magnetic pole structures of the lenses 24 and 26, together with the radius R of the bore 42 in the common pole member 36 and the excitation currents in coils 54 and 56, are so proportioned as to reduce or eliminate several third order aberrations, particularly distortion, the anisotropic aberrations and the chromic magnification error. With these conditions satisfied, high-resolution images suitable for mirofabrication can be obtained. Such optimization is well within the capabilities of those having skilll in the art of electron optics.

As described above, the axial crossover point P toward which the electron rays emitted from the photocathode 10 are focused by the electrostatic and magnetic fields of the upper lens 24 is located preferably within the aperture 46 in the partition structure 34. The aperture 34 will produce a very small electrostatic lens action, but if the beam crossover is positioned at or close to a principal plane of this small lens, then no distortion will be introduced by it.

Inasmuch as the electrostatic field through which the beam 12 passes is well spaced from the wafer W and is isolated therefrom by the shielding action of the partition 34, perturbations of the wafer surface do not affect the electrostatic field. Because of the very small size of the opening 46 through the partition 34, contaminants emitted from the resist coating on wafer W do not enter the upper lens region 30 in quantities considered harmful to the photocathode 10.

Accurate registration of the beam image projected onto the wafer W is accomplished by a unique application of a known registration method which involves the detection of electrons that are backscattered from alignment marks on the wafer. Inasmuch as the general principle is familiar to those skilled in the art, attention will be given herein to the novel details of a registration apparatus which has been designed specifically for use in the environment herein disclosed.

Referring to FIGS. 1 and 2, light pipes or fiber-optic rods 74, 75, 76 and 77 are positioned in radial bores extending through the magnetic pole member 36 to the central bore 42 therein. The inner extremities of these light pipes are close to the axis of beam 12 below the aperture plate 44. The pipes 74 and 76 will be assumed to be on a given X axis, while the pipes 75 and 77 lie on an orthogonally related Y axis, these X and Y axes extending transversely of the beam axis. The ends of the light pipes nearest the beam axis are appropriately angled as indicated in FIG. 1 and are coated with phosphor or other suitable material so that each pipe acts as a detector of backscattered electrons emitted from the wafer W as the electron beam 12 impinges it. Apparatus of conventional type (not shown) responds to the signals received through the various light pipes 74 to 77 for generating other signals that will be used for transversely positioning the electron beam with reference to the aforesaid X and Y axes (FIG. 2) to register the beam image properly on the wafer W in the event there is a lack of registration between the X and Y fiduciary lines introduced into the beam by the original pattern on photocathode 10 and the corresponding X and Y alignment marks on the wafer W.

The registration procedure usually is performed in advance of the image reproduction process. While registration is being performed, only those portions of the photocathode in which the fiduciary lines are located will be unmasked or irradiated. After registration is accomplished, then the reproduction of the circuit pattern on the photocathode may proceed.

Figure 5:
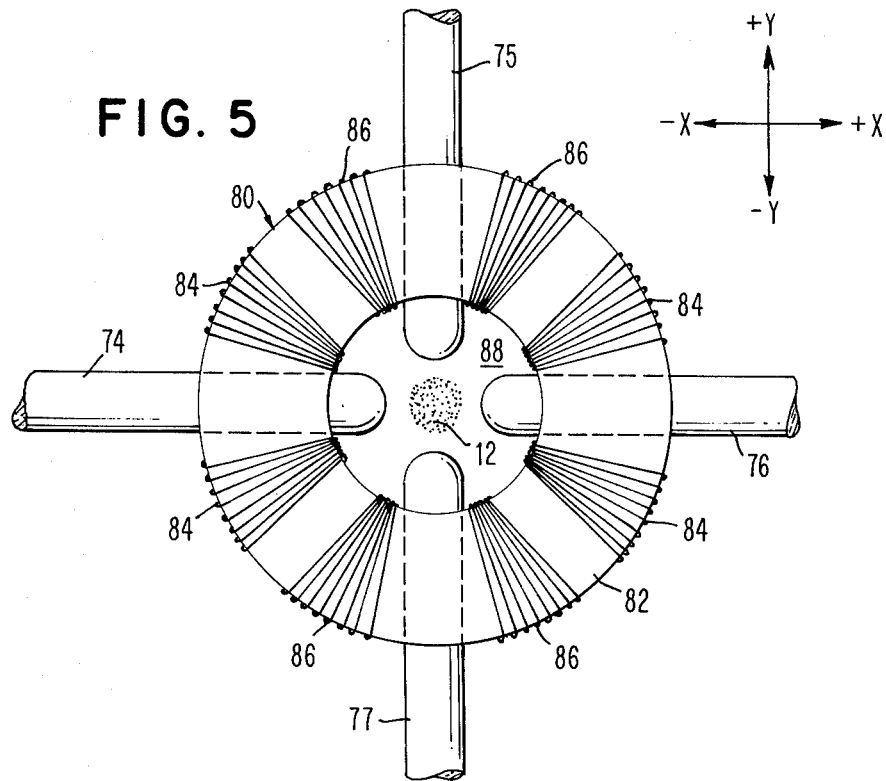
FIG. 5 is a fragmentary plan view of an electromagnetic deflection yoke used in the structure of FIGS. 1 and 2, showing adjacent portions of the light pipes that are employed in association therewith as parts of the image registration means.

To accomplish the beam deflecting function, an electromagnetic deflection yoke 80, FIG. 5, is mounted in the bore 42 (FIG. 1) in the pole member 36, beneath the aperture plate 44. The yoke 80 is of basically conventional construction, comprising an annular core 82 on which are disposed two sets of windings 84 and 86. The electron beam 12 passes through the central opening 88 in the core 82, FIG. 5. The windings 84 may be excited with direct current of either polarity to deflect the beam 12 in the direction of the +X or −X axis. The windings 86 likewise may be excited with direct current of either polarity to deflect the beam 12 in the direction of the +Y or −Y axis. The windings 84 and 86 are selectively excited as may be needed to effect proper beam registration in response to signals from the back-scattered electron detectors which include the light pipes 74 to 77. In order that these pipes 74 to 77 may be accommodated within the deflection yoke 80, the core 82 of yoke 80 is provided with radial bores through which the inner ends of the light pipes extend into the opening 88, where they terminate in proximity to the path of beam 12.

As explained hererinabove, the image registration detectors 74–77, FIGS. 1, 2 and 5, and the beam deflection device 80 are positioned outside of the upper lens region 30 in which the electrostatic field is established. Hence, they cannot perturb this field. This is another feature which contributes to the quality of the image reproduced on the wafer W.

Still another advantage of isolating the electrostatic field within the upper lens region 30 is that it prevents this field from interacting with electrons backscattered from the wafer surface. Hence, the backscattered electrons emitted from the parts of the wafer surface which corresponds to the unmasked areas of the photocathode 10 (FIGS. 1 and 3) will not be forced back by the electrostatic field upon other parts of the wafer surface which corresponds to the masked areas of the photocathode 10. In conventional photocathode beam projection devices this undesirable interaction between backscattered electrons and the electrostatic field has the effect of reducing the contrast between masked and unmasked areas of the pattern, thereby lowering the quality of the reproduced image. In the present apparatus this cannot occur.

Figure 6:
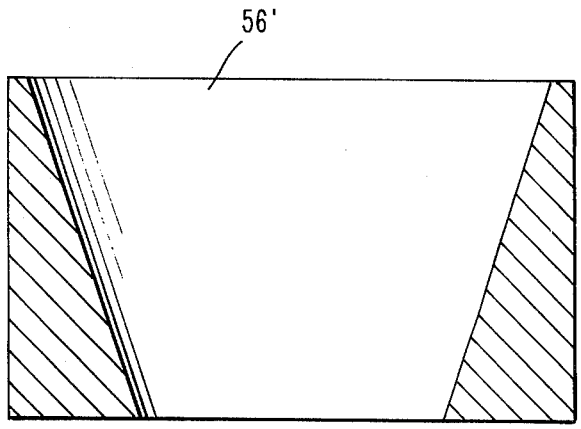
FIG. 6 is a sectional view showing a modified electrostatic field-producing structure that may be utilized in the upper lens.

The electrostatic field may conform to any desired configuration by appropriate shaping of the electrodes, particularly the anode. In FIGS. 1 and 4 the anode is shown as including a cylindrical sleeve 56 with a wall of uniform thickness. FIG. 6 shows an alternative anode configuration in which the inner wall of the modified sleeve 56' has a conical surface. Other variations may be provided as desired.

While the invention has been particularly shown and described with reference to the preferred embodiment thereof, it will be understood by those skilled in the art that the foregoing and other changes in form and details may be made therein without departing from the spirit and scope of the invention.

What is claimed is:

1. In a microfabrication system wherein an electron beam defining a pattern image is projected from a masked photocathode to a sensitized workpiece, the improvement comprising:

a lens structure defining a first region through which the electron beam passes, said lens structure including:

means for producing an electrostatic field in said first region to accelerate the electrons in said beam, and means for producing a magnetic field in said first region to focus said beam at a crossover point in a plane located intermediate the photocathode and the workpiece, said lens structure being arranged so that said first region is spaced from the workpiece;

means defining a second region intermediate said first region and the workpiece through which the beam passes from said crossover point to the workpiece; and a shielding structure between said first and second regions for effectively isolating said second region from the electrostatic field in said first region without interrupting the beam path between said regions.

2. The improvement described in claim 1 wherein said shielding structure includes a portion extending along said plane and having a restricted opening therein at said crossover point to afford passage for the electron beam between said regions.

3. The improvement described in claim 2 wherein the means defining said second region includes means for producing therein a magnetic field to focus the electron beam image upon the workpiece.

4. The improvement described in claim 3 wherein said shielding structure is composed at least in part of magnetic material to provide flux paths for the magnetic fields in both of said regions.

5. The improvement described in claim 2 further including image registration detectors positioned near the beam path outside of said first region to detect electrons backscattered from alignment marks on the workpiece.

6. The improvement described in claims 5 wherein said registration detectors are positioned at least partially within said shielding structure.

7. The improvement described in claim 6 which further includes beam deflecting means under control of said registration detectors and positioned within said shielding structure.

* * * * *